United States Patent [19]

Sato

[11] Patent Number: 5,119,045
[45] Date of Patent: Jun. 2, 1992

[54] PULSE WIDTH MODULATION CIRCUIT

[75] Inventor: Yutaka Sato, Settsu, Japan

[73] Assignee: Ricoh Company, Ltd., Tokyo, Japan

[21] Appl. No.: 691,567

[22] Filed: Apr. 25, 1991

[30] Foreign Application Priority Data

May 7, 1990 [JP] Japan ................................ 2-117990
Jul. 26, 1990 [JP] Japan ................................ 2-200300

[51] Int. Cl.[5] .............................................. H03K 7/00
[52] U.S. Cl. ..................................... 332/109; 331/57;
375/22
[58] Field of Search ....................... 332/106, 109, 110;
331/25, 57, 135; 375/22

[56] References Cited

U.S. PATENT DOCUMENTS 3,805,192 4/1974 Ocraschek et al. ............. 332/109 X
4,524,335 6/1985 Yokoyama ......................... 332/110
4,658,225 4/1987 Dukes et al. ................... 332/109 X Primary Examiner—Robert J. Pascal
Attorney, Agent, or Firm—Cooper & Dunham

[57] ABSTRACT

A pulse width modulation circuit comprising a voltage control type oscillator composed of a ring oscillator which comprises a plurality of delay elements and generates a plurality of output signals having different phases respectively. The PWM circuit further comprises a tap selection circuit for selecting one signal having a phase closest to that of a specific detect signal from the output signals of the oscillator. The PWM circuit further comprises a phase shift circuit for generating a plurality of delay signals having different phases shifted by a regular time in order in response to the selection signal output from the tap selection circuit. The PWM circuit further comprises a waveform shaping circuit for forming a plurality of pulse signals having different pulse widtsh respectively from the delay signals output from the phase shift circuit. And the PWM circuit further comprises a waveform selection circuit for selecting one desired pulse signal from the signals output from the waveform shaping circuit.

9 Claims, 9 Drawing Sheets

PULSE WIDTH MODULATION CIRCUIT

BACKGROUND OF THE INVENTION

1. Field of the Invention

The present invention relates to a pulse width modulation circuit used in a write control device such as a laser beam printer or a digital copying machine.

2. Description of the Related Art

The pulse width of a pulse signal for multiple input data is modulated in such a way that a pluse having a width corresponding to the data is formed with the use of a clock signal having a frequency which is faster than that of the input data.

One type of the pulse width modulation (PWM) circuit comprises a trianglar wave generation circuit which outputs a triangular wave signal synchronizing with the pixel clock, a D/A converter circuit which converts the multiple digital input pixel data to an analogue signal, and a comparator which compares the outputs from the two circuits.

The PWM circuit functions in such a way that if the analogue input data is larger than the triangular wave signal, the comparator outputs a signals "1", while if the analogue input data is smaller than the triangular signal, the comparator outputs a signal "0".

In accordance with another type of the PWM circuit, a pixel clock signal is input to a plurality of delay elements which output predetermined delayed signals, respectively, to a waveform shaping circuit. A waveform selection circuit selects one delayed signal from the waveform shaping circuit in response to an input signal of pixel data and outputs a pulse signal having a width corresponding to the input data.

In accordance with the first PWM circuit mentioned above, it is necessary to prepare analogue circuits such as the D/A converter and the comparator which are very expensive especially when the speed of the pixel clock is very high such as about 10 MHz. Also, it is difficult to form the circuit as one chip of semiconductor integrated circuit.

Also, in accordance with the second PWM circuit mentioned above, since the delayed time of each element is fixed, it becomes nescessary to replace the element by another element when the frequency of the clock signal is changed, which narrows the applicability of the circuit. Besides, if the delay element is to be made from a semiconductor integrated cirCiut, the delay time changes due to the ambient temperature change or the fluctuation of IC process parameter, which makes it difficult to form the whole circuit as one chip of IC.

SUMMARY OF THE INVENTION

It is therefore an object of the present invention to provide a PWM circuit which is inexpensive and capable of outputting pulse signal of stable width with respect to any pixel clock frequency and easy to constitute by one chip of IC.

The above-mentioned object of the present invention can be achieved by a pulse width modulation circuit comprising:

a voltage control type oscillator composed of a ring oscillator which comprises a plurality of delay elements and generates a plurality of output signals having different phases respectively;

a tap selection circuit for selecting one signal having a phase closest to that of a specific detect signal from the output signals of the oscillator;

a phase shift circuit for generating a plurality of delay signals having different phases shifted by a regular time in order in response to the selection signal output from the tap selection circuit;

a waveform shaping circuit for forming a plurality of pulse signals having different pulse widths repectively from the delay signals output from the phase shift circuit; and a waveform selection circuit for selecting one desired pulse signal from the signals output from the waveform shaping circuit.

An advantage of the above mentioned structure of the present invention is that, due to the arrangement of the voltage control type oscillator composed of a ring oscillator, it becomes possible to obtain a clock signal that matches with the phase of the unsynchronized detect signal and modulate the pluse to synchronize with the clock signal.

Another advantage of the present invention is that, due to the arrangement of the delay circuit having the same structure as the oscillator in conjunction with the same control signal as the oscillator to form a pulse wave having a specific width, it becomes possible to uniformly modulate the pulse signal with respect to any frequency of the pixel signal.

Still another advantage of the present invention is that, due to the arrangement of the delay element having the same structure as the VCO that is the ring oscillator, it becomes possible to obtain a stable delay amount irrespective of ambient condition change and the ununiformity of devices.

A further advantage of the present invention is that the delay time is only several ns in the case if IC circuit, which makes it possible to realize a high speed PWM circuit at a low cost.

Also, a still further advantage of the present invention is that, due to the arrangement of the tap selection circuit and a phase shift circuit, it becomes possible to select a waveform having a phase that is most equivalent to that of the detect signal which is generated unsynchronizingly with the system clock signal and that the pulse can be modulated on the basis of the signal having a phase which is delayed by $1/n \times T$ with respect to the selected signal.

A still further advantage of the present invention is that, by using the selected signal as the pixel clock, it becomes possible to output a signal having a width corresponding to the pixel input data which is synchnronized with the pixel clock.

Further objects and advantages of the present invention will be apparent from the following description of the preferred embodiments of the invention as illustrated in the accompanying drawings.

Figure 1:
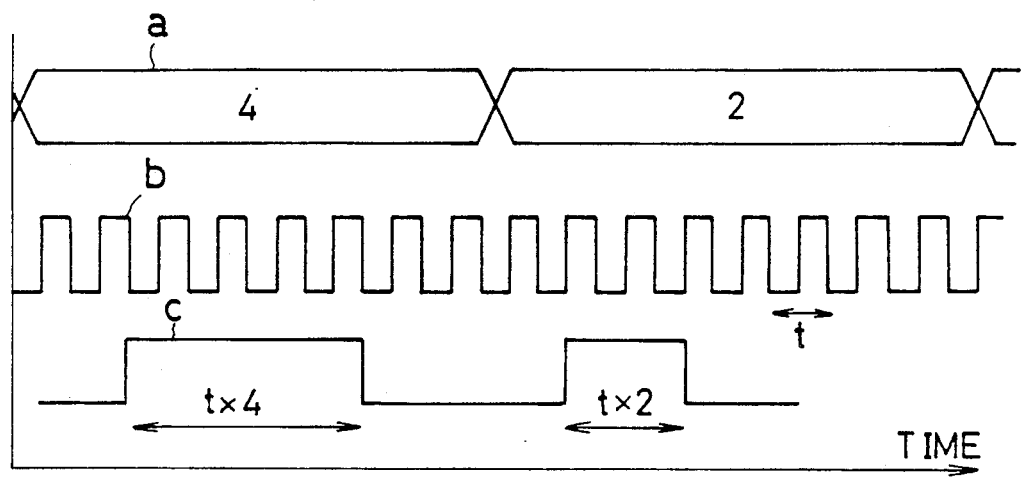
FIG. 1 is a timing chart representing the relation between the input data signal and the pulse width.

DESCRIPTION OF THE PREFERRED EMBODIMENTS described hereafter with reference to the drawings in comparison to the related art which is also described referring to the drawings.

FIG. 1 illustrates the timing relation between the input data and the pulse width. In FIG. 1, line (a) designates an input data signal which comprises 3 bits ($\leq 7$). Line (b) designates a clock signal having a frequency of $\frac{1}{8}$ of the input data frequency. Line (c) designates a PWM signal obtained from the signal (a) with the use of the clock signal (b).

In general, a laser beam printer or a digital copying apparatus uses a high speed pixel clock of about 10 to 20 MHz, which requires a very high frequency such as a clock of 80 to 160 MHz in 8 scales or 160 to 320 MHz in 16 scales. Therefore, it becomes necessary to prepare a high speed element.

A PWM circuit using such a high speed element is described below.

Figure 2:
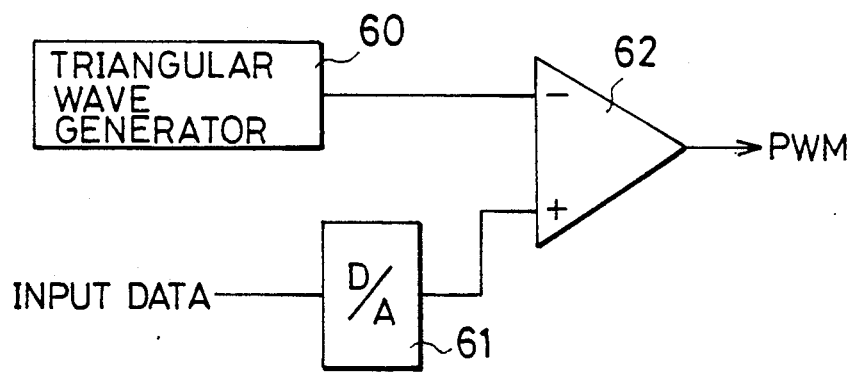
FIG. 2 is a block diagram of an example of the PWM circuit in accordance with a related art.
Figure 3:
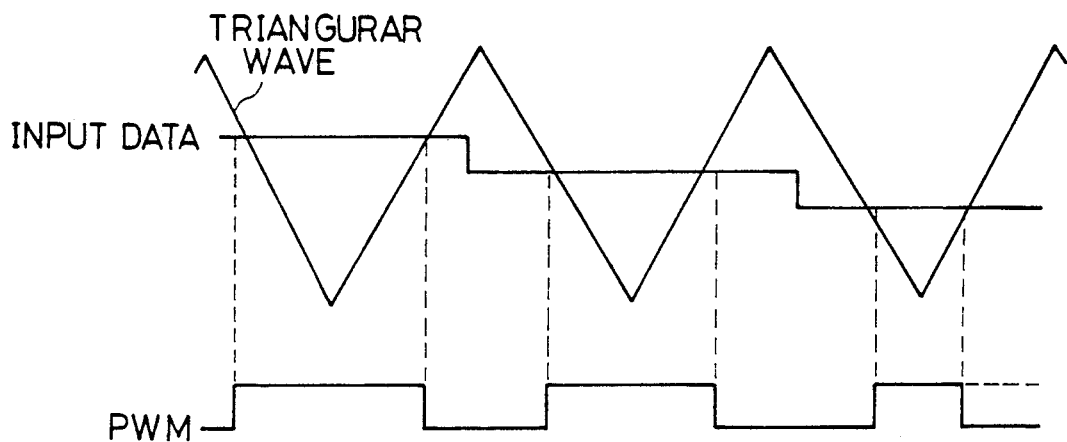
FIG. 3 is a timing chart of the PWM circuit of FIG. 2.

FIG. 2 illustrates a block diagram of the PWM circuit and FIG. 3 illustrates the timing chart of the PWM circuit.

In FIG. 2, numeral 60 designates a triangular wave generation circuit which generates a triangular wave synchronized with the pixel clock. Numeral 61 designates a D/A converter for converting the multiple digital input data signal to an analogue signal. Numeral 62 designates a comparator which compares the outputs of the circuits 60 and 61.

The PWM circuit functions in such a way that if the analogue input data is larger than the triangular wave signal, the comparator 62 outputs a signal "1", while if the analogue input data is smaller than the triangular signal, the comparator 62 outputs a signal "0", as illustrated in FIG. 3.

Figure 4:
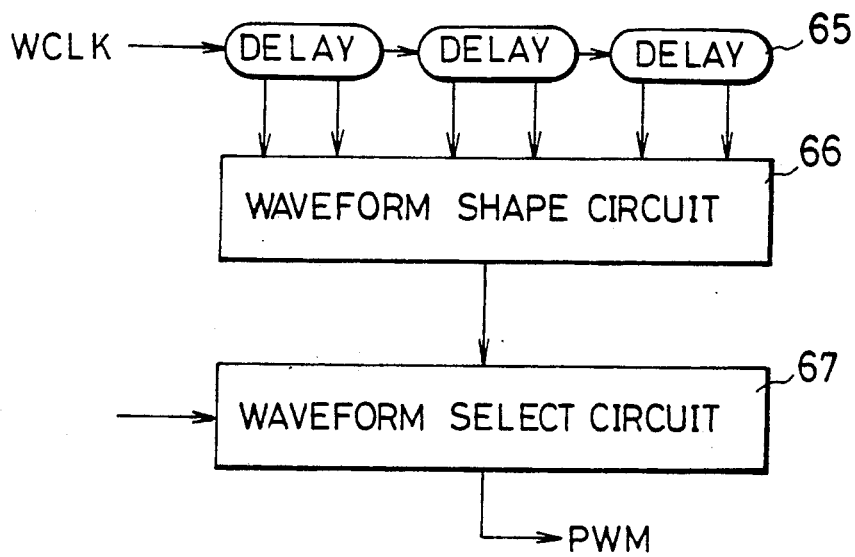
FIG. 4 is a block diagram of another example of the PWM circuit in accordance with the related art.

FIG. 4 illustrates another type of PWM circuit. In accordance with the PWM circuit of FIG. 4, a pixel clock signal is input to a plurality of delay elements 65 which output predetermined delayed signals, respectively, to a waveform shaping circuit 66. A waveform selection circuit 67 selects one pulse modulated signal from the waveform shaping circuit 66 in response to an input signal of pixel data and outputs a pulse signal having a width corresponding to the input data.

In accordance with the first PWM circuit of FIG. 2 mentioned above, it is necessary to prepare analogue circuits such as the D/A converter 61 and the comparator 62 which are very expensive especially when the speed of the pixel clock is very high such as about 10 MHz. Also, it is difficult to form the circuit as one chip of semiconductor integrated circuit.

Also, in accordance with the second PWM circuit of FIG. 4 mentioned above, since the delayed time of each element is fixed, it becomes necessary to replace the element by another element when the frequency of the clock signal is changed, which narrows the applicability of the circuit. Besides, if the delay element is to be made from a semiconductor integrated circuit, the delay time changes due to the ambient temperature change or the fluctuation of IC process parameter, which makes it difficult to form the whole circuit as one chip of IC.

Those problems can be solved by the embodiments of the present invention described below.

Figure 5:
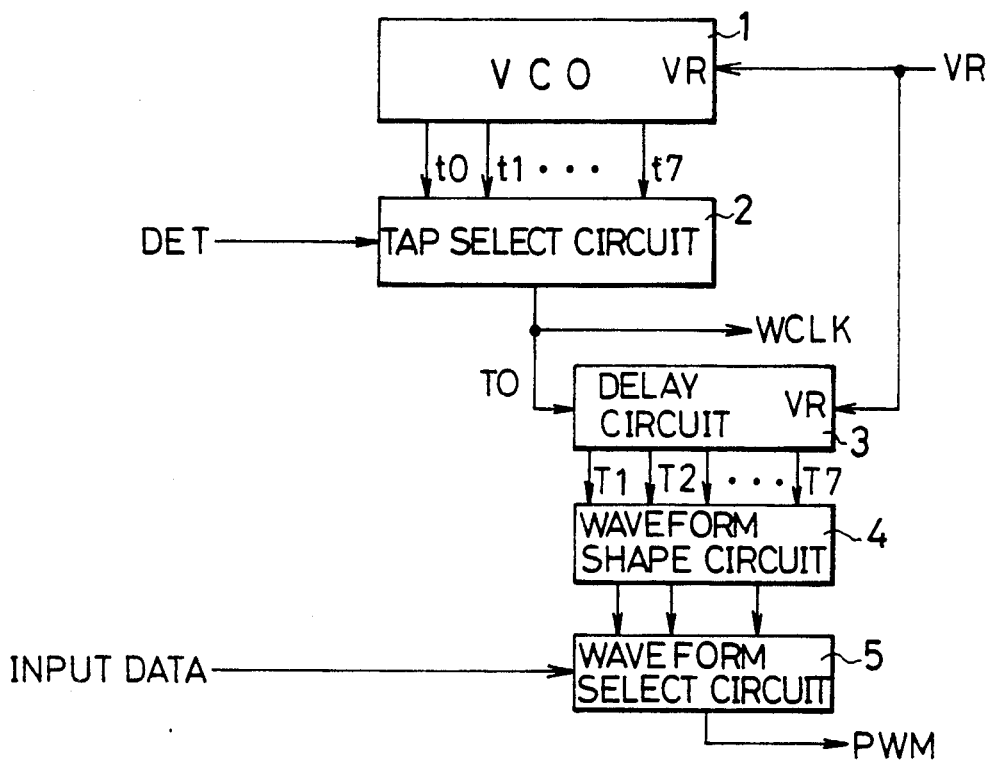
FIG. 5 is a block diagram of an embodiment of the PWM circuit in acordance with the present invention.
Figure 6:
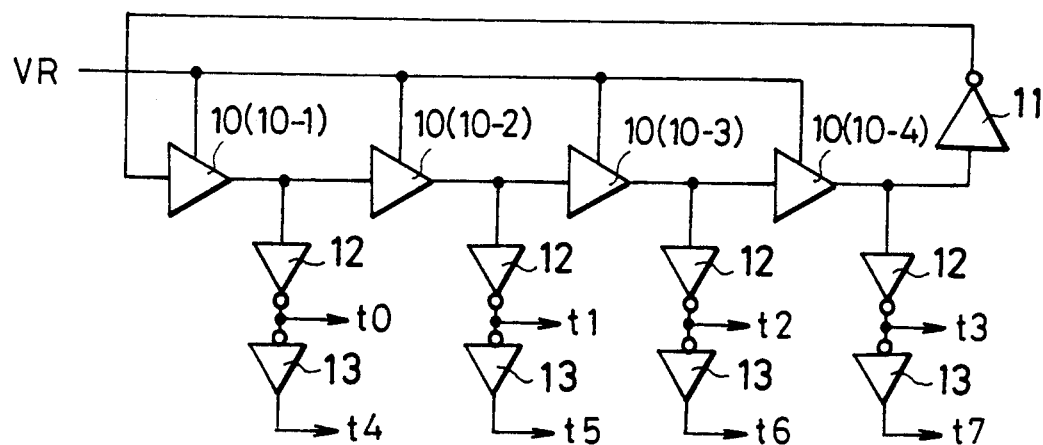
FIG. 6 is a block diagram of the ring oscillator used in the structure of the present invention.

FIG. 5 illustrates a block diagram of an embodiment of the present invention. FIGS. 6 and 7 illustrate circuit diagrams of the ring oscillator and the delay element, respectively, used in the embodiment of FIG. 5.

With reference to FIG. 6, the ring oscillator used in the present invention is described first.

In FIG. 6, numeral 10 designates a delay element. A plurality of delay elements 10-1 to 10-4 are connected in series. The last element 10-4 is connected back to the first element 10-1 through an inverter 11.

The delay time of each element 10 is controlled by voltage which is applied to an input terminal VR.

Further, the output of each element 10 is connected to output terminals t0 to t7 through buffers 12, 13 so that an output clock can be obtained from any of the terminals t0 to t7.

Figure 7A:
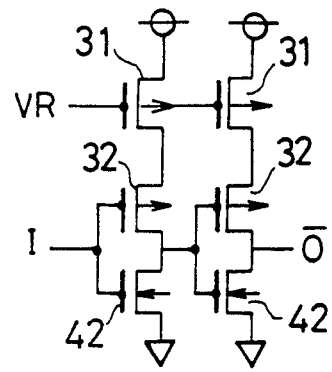
FIGS. 7a and 7b are circuit diagrams of examples of the delay element in accordance with the present invention.
Figure 7B:
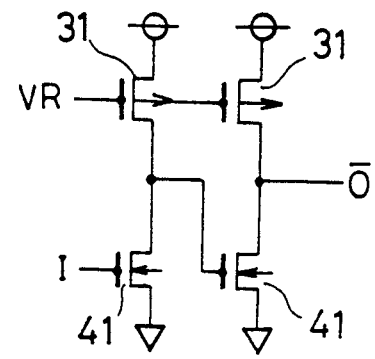

FIGS. 7a and 7b illustrate different examples of the delay element 10, respectively. In the drawings, numerals 31 and 32 designate p-channel MOS transistors, and numerals 41 and 42 designate n-channel MOS transistors, respectively.

In FIG. 7a, the transistors 32 and 42 constitute a buffer. The input and output of the buffer are represented by (I) and (O), respectively. The transistor 31 constitutes the constant current source for the inverter controlled by input voltage VR. Therefore, by controlling the input voltage VR, it becomes possible to control the delay time from the input (I) to the output (O).

In FIG. 7b also, input voltage VR is applied to the transistor 31 which constitutes a constant current source controlled by the voltage VR so that the delay time from the input (I) to the output (O) of the buffer can be controlled by the input voltage VR.

The delay elements described above are arranged as illustrated in FIG. 6 by numerals 10, so that it becomes possible to realize a voltage control type oscillator (VCO) the oscillation frequency of which can be controlled by the voltage VR.

The embodiment of the PWM circuit of the present invention is further described with reference to FIG. 5.

Figure 10:
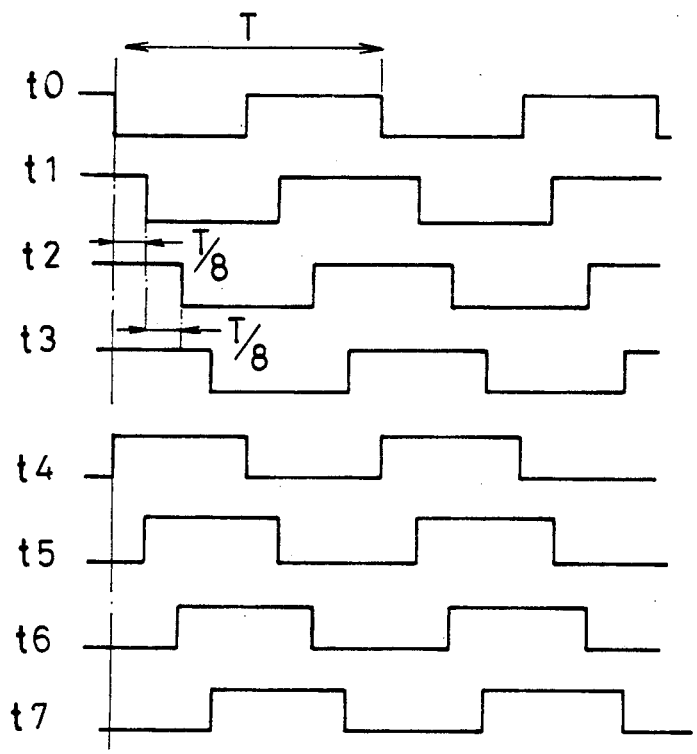
FIG. 10 is a timing chart of the outputs from the VCO used in the present invention.

In FIG. 5, numeral 1 designates a VCO constituted by the above-mentioned ring oscillation comprising the delay elements. The VCO outputs signals having different phase waveforms with a predetermined time shifted from each other in response to the delay time of each delay element control by the voltage VR. The VCO outputs the signals from output terminals t0 to t7, respectively. In this particular embodiment, as illustrated in FIG. 10, clock signals which are shifted by $\frac{1}{8}$ T of phase from each other from the terminals t0 to t7, respectively.

Numeral 2 designates a tap selection circuit which selects a waveform having a phase which is closest to the detect signal (DET) generated irrespectively without synchronization with the signals formed by the delay elements 10 from the output terminals of the VCO 1. The selected signal is used as a pixel write clock signal (WCLK) of the laser beam printer or digital copying machine.

Numeral 3 designates a delay circuit comprising the same delay elements and inverter as those of VCO 1. The control signal VR of the VCO 1 is also applied to the circuit 3 as the control signal thereof. Also, the WCLK signal output from the circuit 2 is input to the circuit 3 which outputs the delayed signals T1 to T7, each being delayed by a predetermined time from the WCLK.

Figure 8:
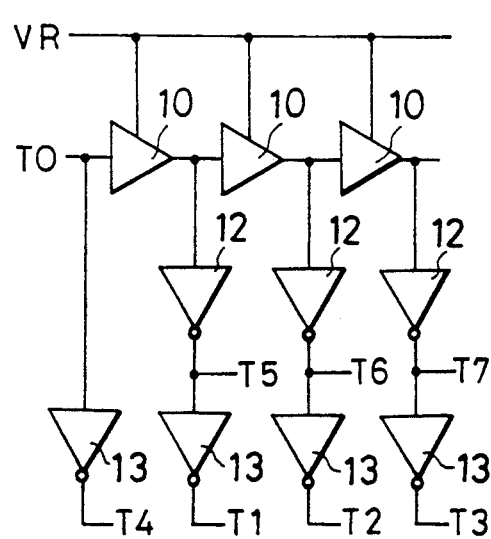
FIG. 8 is a circuit diagram of another example of the delay element in accordance with the present invention.

FIG. 8 illustrates the delay circuit in detail. A plurality of the same delay elements 10 as the ring oscillator of FIG. 6 are arranged to be conneced in series, as illustrated in FIG. 8. The output siganl WCLK of the selection circuit 2 is input to the first delay element 10.

The delay time of the pulse output from each element 10 is controlled by the same voltage VR as the VCO 1.

Further, the output terminals of the elements 10 are connected to output terminals T1 to T7, respectively, through buffers 12, 13 so that an output clock signal can be obtained from any of the terminals T1 to T7.

The delay circuit 3 is composed of the same delay elements as the VCO 1 and controlled by the same control voltage VR as the VCO 1. Therefore, the delay time of each element of the circuit 3 is the same as that of the VCO 1, i.e., T/8. The timing relation between the signals T0 to T7 is substantially the same as that of FIG. 10, wherein references t0 to t7 are replaced by T0 to T7.

Numeral 4 designates a waveform shaping circuit which forms a PWM signal having a specific pulse width in response to each of clocks T4 to T7 output from the delay circuit 3, in this particular embodiment. That is, PWM 1 to PWM 7 are generated from clocks T4 to T7.

Figure 9:
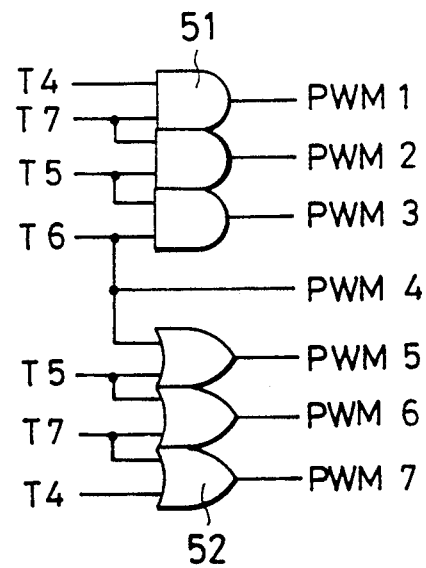
FIG. 9 is a circuit diagram of the waveform shaping circuit of the present invention.
Figure 11:
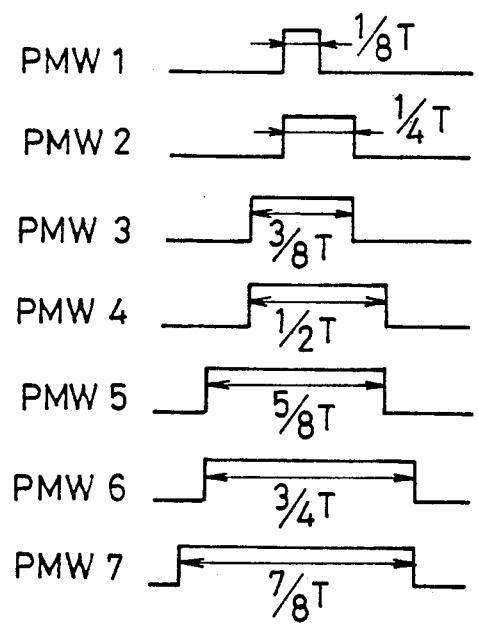
FIG. 11 is a timing chart of different PWM circuits of the present invention.

FIG. 9 illustrates the waveform shaping circuit 4 in detail. As shown in FIG. 9, the circuit 4 comprises AND gates 51 and OR gates 52. The circuit 4 generates PWM signals having pulse widths as illustrated in FIG. 11, respectively, from the input clocks T4 to T7. More precisely, PWM 1 having pulse width of $\frac{1}{8}$ T can be formed from clock signals T4 and T7 through the AND gate, as can be seen from FIG. 10, wherein t0 to t7 are to be replaced by T0 to T7 in this case. Similarly, PWM 2 having pulse width of $\frac{1}{4}$ T can be formed from clock signals T7 and T5 through an AND gate. Also, PWM 3 having pulse width of $\frac{3}{8}$ T can be formed from clock signals T5 and T6 through an AND gate. PWM 4 having pulse width of $\frac{1}{2}$ T can be formed solely from the clock signal T6.

On the other hand, PWM 5 having pulse width of $\frac{5}{8}$ T can be formed from clock signals T6 and T5 through an OR gate, as can be seen from FIG. 10. Similarly, PWM 6 having pulse width of $\frac{3}{4}$ can be formed from clock signals T5 and T7 through an OR circuit. Also, PWM 7 having pulse width of 7/8 T can be formed from clock signals T7 and T4 through an OR gate.

Numeral 5 designates a waveform selection circuit which selects one PWM signal that corresponds to the multiple pixel data from PWMs 1 to 7 formed by the circuit 4 and outputs a PWM data signal.

The function of the embodiment of the present invention is further described below.

VCO 1 oscillates with a frequency of T and outputs clock signals t0 to t7 having different phases shifted each by T/8 from the preceding number signal. The signals are transmitted to the tap selection circuit 2. The circuit 2 selects one clock signal from the signals t0 to t7 which has a phase closest to that of the DET signal which is generated independently without being synchronized with the signals t0 to t7. The selected signal is transmitted to the delay circuit 3. Assuming that the selected signal is designated by T0, the signal T0 becomes the WCLK signal. The signal T0 is input to the circuit 3 to which the control voltage VR is input as well.

As mentioned above, clock signals which are being shifted by T/8 phase from one another are input to the waveform shaping circuit 4. The circuit 4 generates clock signals PWM 1 to PWM 7 having pulse widths $\frac{1}{8}$ T, $\frac{1}{4}$ T, . . . , 7/8 T, respectively, as illustrated in FIG. 11.

A multiple pixel writing data is input to the waveform selection circuit 5 which selects a PWM signal corresponding to the data signal. At this time, the same control voltage signal as the VCO 1 is input to the delay circuit 3, so that it becomes possible to obtain pulse waveforms having widths different by $\frac{1}{8}$ from one another for any value of the frequency of T.

Also, by presetting the relation between the delay circuit 3 and the input voltage VR, it becomes possible to make a waveform having a predetermined width for any frequency T by applying corresponding voltage VR to the circuit 3 from outside.

Therefore, the pulse width for the input data is modulated so that the pulse phase matches with the unsynchronized DET signal and that the pulse is desirably modulated for any WCLK signal and T.

Figure 12:
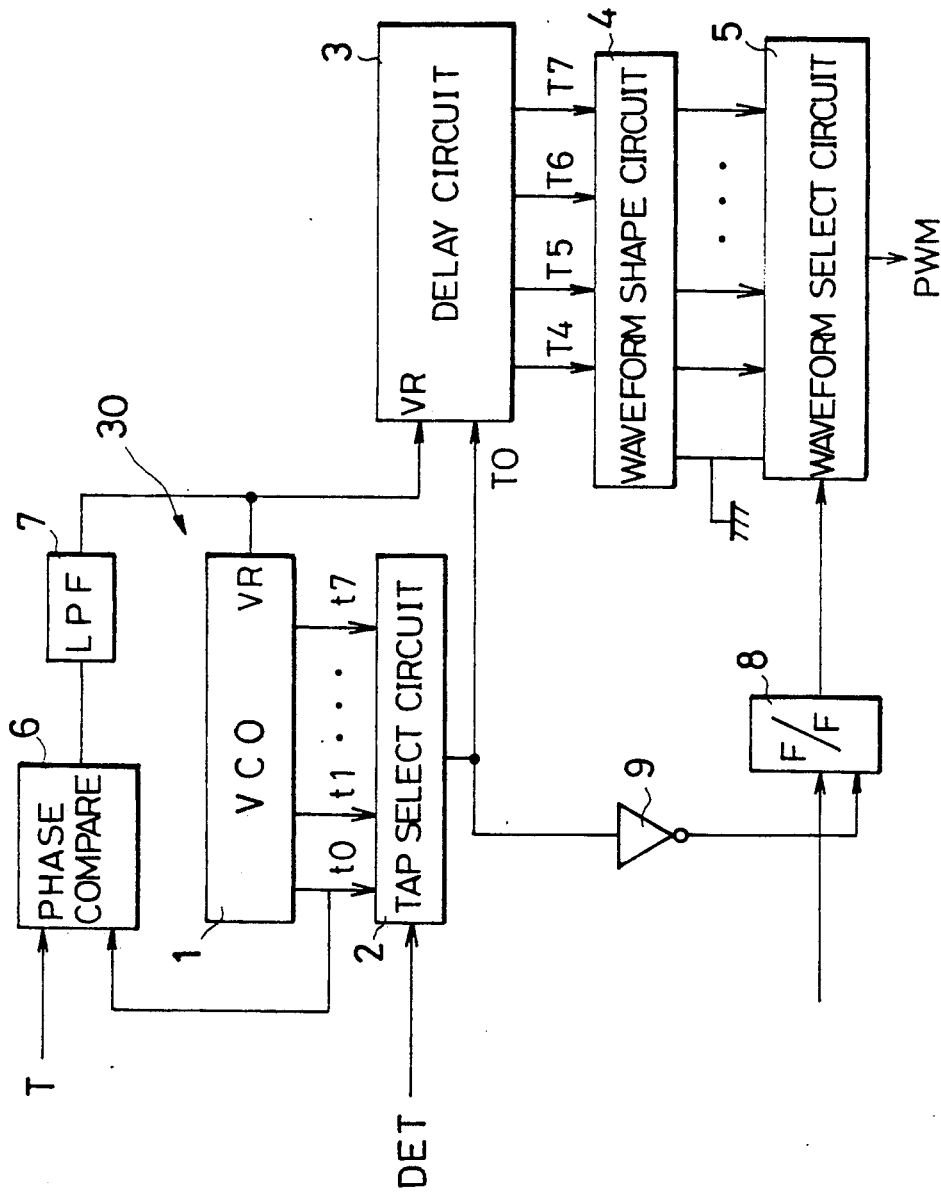
FIG. 12 is a block diagram of another embodiment of the PWM circuit in accordance with the present invention.

FIG. 12 illustrates another embodiment of the PWM circuit in accordance with the present invention.

In the embodiment of FIG. 12 VCO 1 is assembled within a phase locked loop (PLL) so that the circuit can cope with a wide variety of signals of various frequencies. Numerals 6 and 7 designate a phase comparator and a low pass filter, respectively. VR of FIG. 5 is applied to the input of VCO 1. The output of VCO 1 can be taken out from any one of the output terminals t0 to t7.

A reference clock T and the output t0 of VCO 1 are input to the comparator 6 as a clock input thereof. The output of the comprator 6 which corresponds to the phase difference between the clocks T and t0 is transmitted to the filler 7. The output of the filter 7 is input to VCO 1 as the VR input thereof.

When the PLL 30 is locked, it oscillates with the same frequency as the reference clock T. At this time, VCO 1 outputs clock signals t0 to t7 having different phases shifted by T/8 from one another as illustrated in FIG. 10. The output signals are transmitted to the tap selection circuit 2. The circuit 2 selects one signal from the clocks t0 to t7 which has a phase closest to the DET signal which is not synchronized with the clocks t0 to t7. The selected signal is tranmitted to the delay circuit 3. The selected signal output from the circuit 2 is also transmitted to a flip-flop 8 through an inverter 9. The selected signal which is designated by t0 is used as the WCLK. To the circuit 3 is input a control signal VR as well as the signal T0. The delay time of the circuit 3 is T/8 that is the same as that of each delay element of VCO 1 since the circuit 3 is composed of the same elements as the VCO 1 and controlled by the same voltage VR as the VCO 1. The timing relation between the signals T0 to T7 is the same as the timing chart of FIG. 10 assuming that references t0 to t7 are replaced by T0 to T7, respectively, in the timing chart.

The clocks T4 to T7 haveng different phases shifted by T/8 from one another are input to a waveform shaping circuit 4 which generates clock signals PWM 1 to PWM 7 having pulse widths ⅛ T, ¼ T, ..., 7/8 T, respectively, as illustrated in FIG. 11.

When a multiple pixel data is input to the flip-flop 8, the date signal is latched at the rising timing of the signal T0. The data is input to a waveform selection circuit 5 which selects a PWM signal corresponding to the input data signal.

When the delay circuit is to be constituted within an IC, it is difficult to obtain a stable characteristic since the IC is much influenced by the temperature or other parameters of process. However, in accordance with the present invention, it becomes possible to obtain a constant delay time, irrespective of environmental conditions or ununiformity of devices, since the delay elements are arranged as the same as those of the ring oscillator VCO. Besides, an IC can be used to realize an inexpensive and high speed PWM circuit as a whole since the delay time is only sevral ns.

Figure 13:
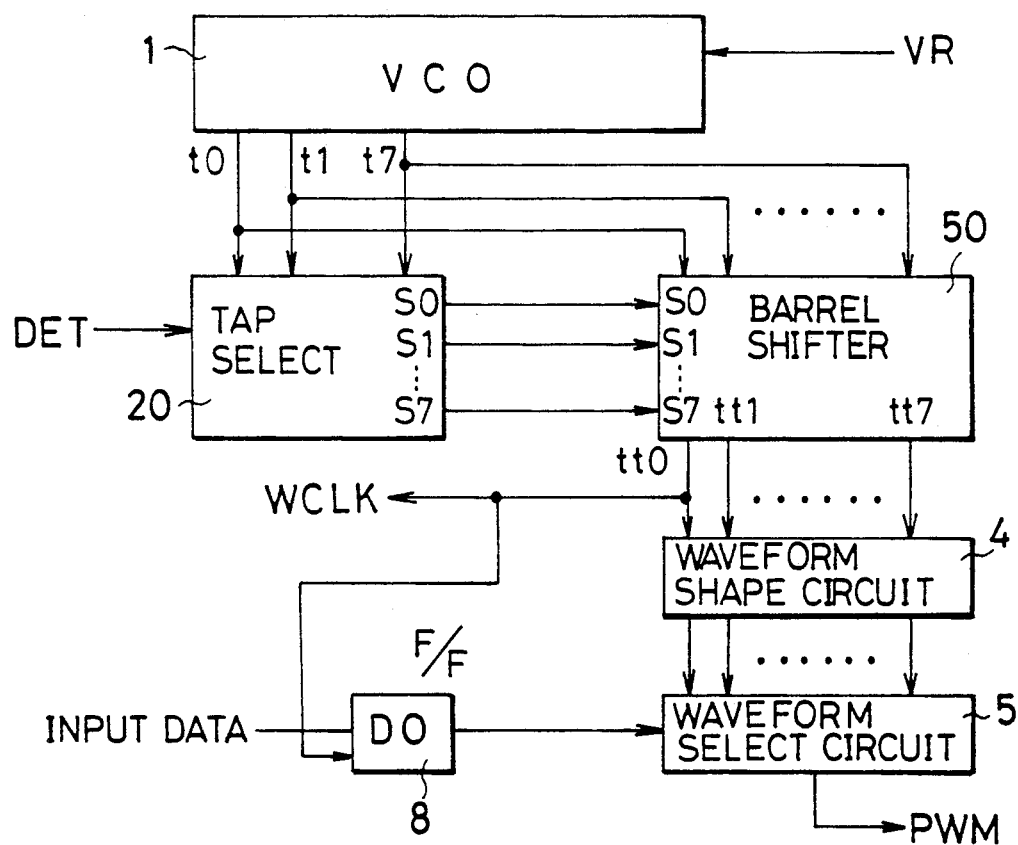
FIG. 13 is a block diagram of still another embodiment of the PWM circuit in accordance with the present invention.

FIG. 13 illustrates a still another embodiment of the PWM circuit in accordance with the present invention.

In FIG. 13, VCO 1 is constituted by a ring oscillator having eight delay steps and outputs signals t0 to t7 having different phase shifted by a predetermined time in response to the delay time of each delay element controlled by the input voltage VR. The arrangement of the VCO 1 is substantially the same as that of FIG. 6 and the delay element is substantially the same as that of FIG. 7.

In accordance with the embodiment of FIG. 13, VCO 1 outputs clock signals t0 to t7 having different phases shifted by ⅛ T as illustrated in FIG. 10 wherein T designates the frequency of oscillation of VCO 1.

The output signals t0 to t7 are transmitted to a tap selection circuit 20 and a barrel shifter 50.

To the circuit 20 is input a DET signal which is generated independently from signals from the delay elements and not synchronized with the delay signals. The circuit 20 selects one signal from the outputs t0 to t7 from VCO 1 which has a phase closest to the phase of the DET signal. The signal information is transmitted to the barrel shifter 50 through output terminals S0 to S7 of the circuit 20.

Figure 14:
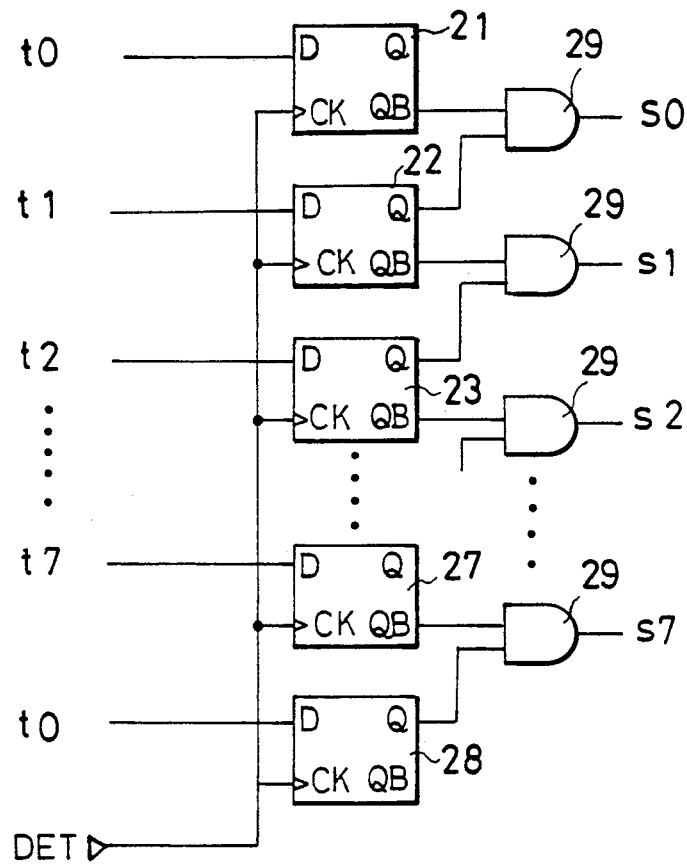
FIG. 14 is a circuit diagram of the tap selection circuit used in the PWM circuit of the present invention.

FIG. 14 illustrates the construction of the tap selection circuit 20. The circuit 20 comprises a plurality of flip-flops 21 to 28. To the D terminal of each flip-flop is connected one of outputs t0 to t7 of VCO 1. The DET signal is applied to the flip-flop through the clock terminal CK. Adjacent two flip-flops are connected in such a way that the QB output of the first flip-flop and the Q output of the second flip-flop are transmitted to an AND circuit 29 which outputs a signal (one of S0 to S7) having a phase closest to that of the DET signal. For example, in the event that at the timing when the waveform of the signal t1 falls the DET signal is generated and latched by the flip-flops 21 to 28, the output S1 becomes "1" while the other outputs S0 and S2 to S7 becomes "0". The output signals S0 to S7 are transmitted to the barrel shifter 50.

Figure 15:
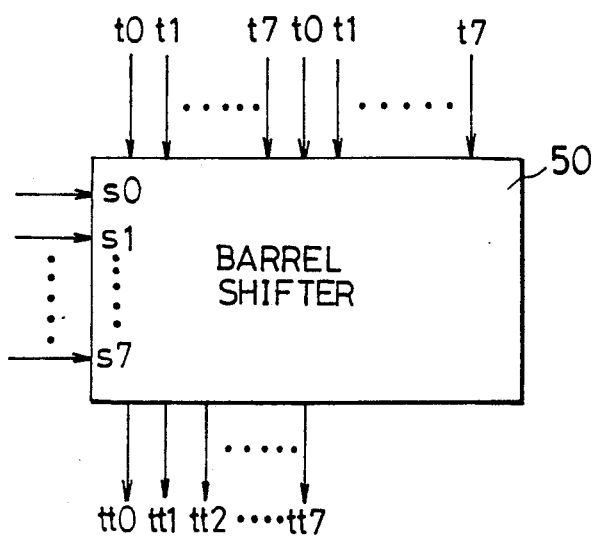
FIG. 15 is a block diagram of the barrel shifter used in the PWM circuit of the present invention.

FIG. 15 illustrates the barrel shifter 50 in detail. For example, 16 bit signals are input to the barrel shifter 50 which outputs signals tt0 to tt7 which are shifted by a desired steps from each other. In the event that only the signal S1 of the outputs from the circuit 20 is "1" while the other signals S0 and S2 to S7 are "0", the barrel shifter 50 shifts the input signals t0 to t7 transmitted from VCO 1 by one step so that it outputs t1 through tt0, t2 through tt1, ..., and t0 through tt7. That is, one signal tn having a phase closest to that of DET signal is output from the output terminal tt0 of the barrel shifter 50. The output signal tt0 is used as the pixel clock (WCLK) so that pulse signals having different phases shifted by T/8 from one another in series from WCLK are output through the terminals tt1 to tt7. The timing relation between the signals tt0 to tt7 is the same as represented by the timing chart of FIG. 10 assuming that the references t0 to t7 are replaced by tt0 to tt7, respectively.

The outputs tt0 to tt7 are transmitted to the waveform shaping circuit 4. Also, the output tt0 (WCLK) is transmitted to the flip-flop 8.

The circuit 4 generates PWM signals having specific pulse widths using the clocks tt4 to tt7 in this particular embodiment. That is, the signals PWM 1 to PWM 7 are generated from the clocks tt4 to tt7.

Figure 16:
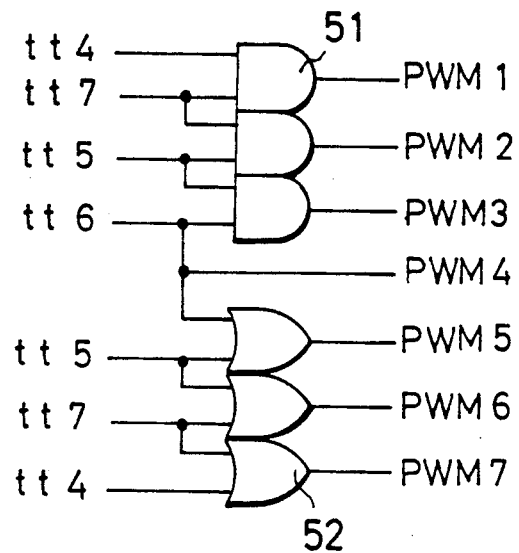
FIG. 16 is a circuit diagram of an example of the waveform shaping circuit of the present invention.

FIG. 16 illustrates the waveform shaping circuit 4 in detail. As illustrated in FIG. 16, the circuit 4 comprises three AND gates 51 and three OR gates 52 so as to form PWM signals having pulse widths as illustrated in FIG. 11 from the input clocks tt4 to tt7.

More precisely, the pulse PWM 1 having a pulse width of ⅛ T is formed by the AND logic through the AND gate 51 using the clocks tt4 and tt7, as can be seen from the timing relation of FIG. 10. Similarly, the pulse PWM 2 having a width of ¼ T is formed by the AND logic using the clocks tt7 and tt5. Also, the pulse PWM 3 having a width of ⅜ T is formed by the AND logic using the clocks tt5 and tt6. Also, the pulse PWM 4 having a width of ½ T is formed from the clock tt6.

On the other hand, the pulse PWM 5 having a pulse width of ⅝ T is formed by the OR logic through the OR gate 52 using the clocks tt6 and tt5, as can be seen from the timing chart of FIG. 10. Similarly, the pulse PWM 6 having a pulse width of ¾ T is formed by the OR logic using the clocks tt5 and tt7. Also, the pulse PWM 7 having a pulse width of 7/8 T is formed by the OR logic using the clocks tt7 and tt4.

The signals PWM 1 to 7 having different pulse widths by ⅛ from each other in order are transmitted from the circuit 4 to the waveform selection circuit 5. When the multiple pixel data is input to the flip-flop 8, it is latched at the timing when the clock WCLK rises and input to the circuit 5 which selects one PWM signal corresponding to the multiple pixel data.

Figure 17:
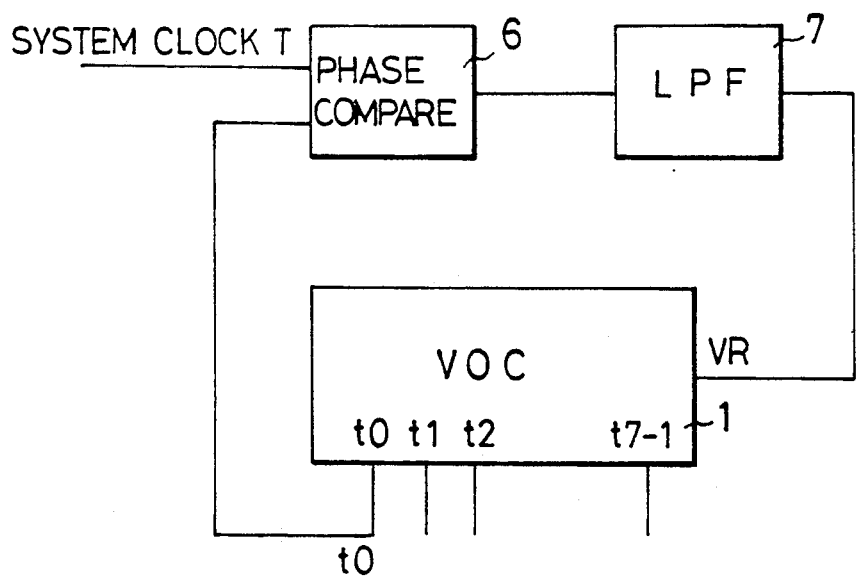
FIG. 17 is a block diagram of the circuit in which a PLL is used.

In accordance with the embodiment of FIG. 13, as the preceding embodiment of FIG. 12, it becomes possible to obtain pulses having different phases shifted by $1/n \times T$ from each other with respect to any frequency of pixel signal in a pulse generation system, by constituting the PLL circuit as illustrated in FIG. 17, due to the arrangement of the ring oscillator 1 using the delay elements. In the above explanation, T represents the frequency of the system and n represents the tap number.

In the structure of FIG. 17, the system clock T and the output t0 of VCO 1 are input to the comparator 6, as in the case of the structure of FIG. 12, so that the output voltage corresponding to the phase difference between the clocks t0 and T is input to the low-pass filter 7. The output of the filter 7 is applied to the VCO 1 through the VR input terminal. When the PLL 30 is locked, the circuit oscillates with the same frequency as the system clock T.

During this process, VCO 1 outputs clocks t0 to tn−1 having different phases shifted by T/n from one another in order.

Many widely different embodiments of the present invention may be constructed without departing from the spirit and scope of the present invention. It should be understood that the present invention is not limited to the specific embodiments described in the specification, exept as defined in the appended claims.

What is claimed is:

1. A pulse width modulation circuit comprising:
   a voltage control type oscillator composed of a ring oscillator which comprises a plurality of delay elements and generates a plurality of output signals having different phases respectively;
   a tap selection circuit for selecting one signal having a phase closest to that of a specific detect signal from said output signals of said oscillator;
   a phase shift circuit for generating a plurality of delay signals having different phases shifted by a regular time in order in response to the selection signal output from said tap selection circuit;
   a waveform shaping circuit for forming a plurality of pulse signals having different pulse widths respectively from said delay signals output from said phase shift circuit; and
   a waveform selection circuit for selecting one desired pulse signal from said signals output from said waveform shaping circuit.

2. A pulse width modulation circuit according to claim 1, wherein said phase shift circuit comprises a delay circuit which is composed of the same delay elements as said oscillator and applied with the same control voltage as said oscillator.

3. A pulse width modulation circuit according to claim 1, wherein said phase shift circuit comprises a barrel shifter to which the outputs of said oscillator are input, said barrel shifter shifting the phase of said outputs from said oscillator by a step in response to the output of said tap selection circuit.

4. A pulse width modulation circuit according to claim 1, wherein said voltage control type oscillator is constituted in such a manner that a plurality of delay elements are connected in series, the output of the last element is connected back to the input of the first element through an invention circuit to form a ring circuit and a plurality of outputs of different delay time are taken out from between said delay elements through a buffer circuit.

5. A pulse width modulation circuit according to 1, wherein said waveform shaping circuit comprises a plurality of AND gates and OR gates so that, with regard to clock signals of any frequency having different phases respectively, two clock signals are inputted to said AND gate or said OR gate to obtain a pulse signal having a predetermined width.

6. A pulse width modulation circuit according to claim 2, wherein said voltage control type oscillator is constituted in such a manner that a plurality of delay elements are connected in series, the output of the last element is connected back to the input of the first element through an invention circuit to form a ring circuit and a plurality of outputs of different delay time are taken out from between said delay elements through a buffer circuit.

7. A pulse width modulation circuit according to claim 3, wherein said voltage control type oscillator is constituted in such a manner that a plurality of delay elements are connected in series, the output of the last element is connected back to the input of the first element through an invention circuit to form a ring circuit and a plurality of outputs of different delay time are taken out from between said delay elements through a buffer circuit.

8. A pulse width modulation circuit according to claim 2, wherein said waveform shaping circuit comprises a plurality of AND gates and OR gates so that, with regard to clock signals of any frequency having different phases respectively, two clock signals are inputted to said AND gate or said OR gate to obtain a pulse signal having a predetermined width.

9. A pulse width modulation circuit according to claim 3, wherein said waveform shaping circuit comprises a plurality of AND gates and OR gates so that, with regard to clock signals of any frequency having different phases respectively, two clock signals are inputted to said AND gate or said OR gate to obtain a pulse signal having a predetermined width.

* * * * *